United States Patent
Uchihira

(10) Patent No.: US 6,178,137 B1
(45) Date of Patent: Jan. 23, 2001

(54) CLOCK-SYNCHRONIZING SEMICONDUCTOR MEMORY DEVICE

(75) Inventor: Teruyuki Uchihira, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/122,774

(22) Filed: Jul. 27, 1998

(30) Foreign Application Priority Data

Jul. 25, 1997 (JP) .................................................. 9-216021

(51) Int. Cl.[7] ........................................................ G11C 8/00
(52) U.S. Cl. ............................ 365/233; 365/226; 327/142
(58) Field of Search ................................. 365/233, 226, 365/189.05; 327/142, 143

(56) References Cited

U.S. PATENT DOCUMENTS

| 5,278,792 | * | 1/1994 | Inoue et al. | 365/193 |
| 5,323,066 | * | 6/1994 | Feddeler et al. | 307/272.3 |
| 5,365,481 | * | 11/1994 | Sawada | 365/201 |
| 5,448,716 | * | 9/1995 | Hardell, Jr. et al. | 395/550 |
| 5,703,804 | * | 12/1997 | Takada et al. | 365/145 |
| 5,870,342 | * | 2/1999 | Fukuda | 365/201 |

FOREIGN PATENT DOCUMENTS 9-134593    5/1997    (JP) .

* cited by examiner

Primary Examiner—Richard Elms
Assistant Examiner—Hien Nguyen
(74) Attorney, Agent, or Firm—Young & Thompson

(57) ABSTRACT

The clock-synchronizing semiconductor memory device has a reset circuit which is capable of optionally setting a timing for releasing the device from a reset state and also keeping an output buffer in a high impedance state in a time period from a power-ON to a rise of an initial clock cycle of a clock signal "CLK".

18 Claims, 9 Drawing Sheets

CLOCK-SYNCHRONIZING SEMICONDUCTOR MEMORY DEVICE

BACKGROUND OF THE INVENTION

The present invention relates in general to a semiconductor device, and more particularly to an improved clock-synchronizing semiconductor memory device operable in output in synchronizing with clock signals.

FIG. 1 is a block diagram illustrative of a conventional clock-synchronizing semiconductor memory device. A structure of the conventional clock-synchronizing semiconductor memory device will be described with reference to FIG. 1.

The conventional clock-synchronizing semiconductor memory device has an address register 1 for receiving an address input and outputting address data in synchronizing with an externally inputted clock signal "CLK". The address register 1 sends the input value to the output side upon rise-edge of the clock signal "CLK" for subsequent holding the value until the next rise-edge of the clock signal "CLK". Further, an address decoder 2 is provided which is connected to the address register 1 for receiving the address data from the address register 1. A memory cell array is also provided which is connected to the address decoder 2 for receiving the address data from the address decoder 2. An input register 6 is also provided which receives data externally inputted. The input register 6 also receives the clock signal "CLK" so that the input register 6 is operable in synchronizing with the clock signal "CLK". The input register 6 sends the input value to the output side upon rise-edge of the clock signal "CLK" for subsequent holding the value until the next rise-edge of the clock signal "CLK". The input register 6 is connected to the memory cell array 3 so as to transmit data to the memory cell array 3, whereby the data are stored in the memory cell array 3 at a designated address from the address decoder. An output register 4 is further provided which is connected to the memory cell array 3 for fetching the data from the memory cell array 3. The output register 4 receives the clock signal "CLK" so that the output register 4 is operable in synchronizing with the clock signal "CLK". The output register 4 sends the input value to the output side upon rise-edge of the clock signal "CLK" for subsequent holding the value until the next rise-edge of the clock signal "CLK". An output buffer 5 is further provided which is connected to the output register 4 for receiving the output data from the output resistor 4. The output buffer 5 is controlled by the following signals and circuits. A register 7 is provided which receives the clock signal "CLK" and a chip select enable signal "CE". A NAND gate 11 is also provided which has two inputs, one of which is connected to an output of the register 7, for receiving the chip select enable signal "CE" and an output signal from the register 7. The register 7 is operable in synchronizing with the clock signal "CLK". The register 7 sends the input value to the output side upon rise-edge of the clock signal "CLK" for subsequent holding the value until the next rise-edge of the clock signal "CLK". A NOR gate 12 is also provided which has two inputs, one of which is connected to an output of the NAND gate 11, for receiving an output signal from the NAND gate 11 and a write enable signal "WE". An output enable register 8 is also provided which has two inputs, one of which is connected to an output of the NOR gate 12, for receiving an output from the NOR gate 12 and also receiving the clock signal CLK. The output enable resistor 8 is operable in synchronizing with the clock signal CLK to output an output "CE2". The output enable register 8 sends the input value to the output side upon rise-edge of the clock signal "CLK" for subsequent holding the value until the next rise-edge of the clock signal "CLK". An invertor 13 is also provided which has an input for receiving an output enable signal "OE-bar" and then outputting the output enable signal "OE". An AND gate 10 is also provided which has two inputs, wherein one input is connected to an output of the output enable register 8 for receiving the output "CE2" from the output enable register 8 and another input is connected to an output of the invertor 13 for receiving the output enable signal "OE" from the invertor 13. The output enable signal "OE" is not synchronizing with the clock signal CLK, whilst the output "CE2" is synchronizing with the clock signal CLK. The AND gate 10 has an output which is connected to the output buffer 5 so that the output buffer 5 is controlled by the output signal from the AND gate 10.

Operations of the above conventional clock-synchronizing semiconductor memory device will be described with reference again to FIG. 1. The output operation of the output buffer 5 is made under the control in accordance with an output control logic signal from the AND gate 10. This output control logic signal is determined by both the value "CE2" transmitted from the output enable register 8 and the output enable signal "OE" from the invertor 13. Namely, the output operation of the output buffer 5 depends upon both the value "CE2" transmitted from the output enable register 8 and the externally inputted output enable signal "OE-bar". A value to be inputted into the output enable register 8 is determined by the write-enable signal "WE" and the chip select enable signal "CE".

In write-state, the write enable signal is in high level, for which reason the output "CE2" of the output enable register 8 becomes low level upon the next rise of the clock cycle of the clock signal CLK, whereby the output buffer 5 enters into the high impedance state. When the write enable signal "WE" is in the low level and the chip select enable signal "CE" is in the high level, then the output enable signal "OE-bar" being in the low level makes the output buffer in the low impedance state, resulting in an output of the value having stored in the output register 4.

If the chip select signal enters into the high level at the same time when the address is inputted into the address register 1, then the data are outputted from the output buffer 5 in the next clock cycle, for which reason the output timing of the data from the output buffer 5 is adjusted by the register 7.

In the meantime, the above conventional semiconductor memory device has the following problems.

In a time duration from a power-ON to an initial rise of the clock cycle of the clock signal "CLK", an output value of the output enable register 8 is indefinite. Namely, in the time duration from the power-ON to the rise of the initial clock cycle of the clock signal "CLK", the output buffer may enter into the low impedance state whereby a short circuit current may be applied between the input terminal of this semiconductor memory device and other semiconductor device.

In order to prevent the short circuit current, it is required that the output enable signal "OE-bar" not synchronizing with the clock signal "CLK" is fixed at the high level upon the power ON to keep the output buffer 5 in the high impedance state. Otherwise, it is required to add an additional circuit which is operated to set the value stored in the output enable register so that the output from the register becomes low level upon power-ON.

FIG. 2 is a circuit diagram illustrative of a circuit configuration of the output enable register 8 of the conventional clock-synchronizing semiconductor memory device shown in FIG. 1. Operations of the output enable register 8 will be described with reference to FIG. 2. If, immediately after the power-ON, a power voltage does not achieve a threshold voltage of a p-channel MOS field effect transistor P4, then a node 41 has a voltage of 0 V, whereby a p-channel MOS field effect transistor P3 becomes conductive to an n-channel MOS field effect transistor N2. A value stored in a register is held, wherein the register comprises a master slave flip flop circuit which comprises a transfer gate and an invertor. After the power voltage becomes beyond the threshold voltage of the p-channel MOS field effect transistor P4, then the p-channel MOS field effect transistor P4 enters into a conductive state, whereby the potential of the node 41 is risen to place the p-channel MOS filed effect transistor P3 and the n-channel MOS field effect transistor N2 into the non-conductive state.

In the above manners, the value from the output enable register 8 can be held at the low level upon the power-ON. However, a transistor is used which has a larger size than that of the invertor constituting the register. For this reason, after the register is commenced to operate by the clock signal "CLK", an operational speed of the register is dropped due to capacitances of the drains of the p-channel MOS field effect transistor P3 and the n-channel MOS field effect transistor N2.

In the above circumstances, it had been required to develop a novel clock-synchronizing semiconductor memory device free from the above problems.

SUMMARY OF THE INVENTION

Accordingly, it is an object of the present invention to provide a novel clock-synchronizing semiconductor memory device free from the above problems.

It is a further object of the present invention to provide a novel clock-synchronizing semiconductor memory device which is capable of preventing an output buffer from entering into a low impedance state in a time period from a power-ON to a rise of an initial clock of a clock signal so as to prevent any substantive short circuit current between the output buffer and other transistor connected to the output buffer.

The novel clock-synchronizing semiconductor memory device has a reset circuit which is capable of optionally setting a timing for releasing the device from a reset state and also keeping an output buffer in a high impedance state in a time period from a power-ON to a rise of an initial clock cycle of a clock signal "CLK".

It is preferable that the novel clock-synchronizing semiconductor memory device has a power-ON detection circuit for initializing an output upon a power-ON, and a reset circuit for a reset signal which releases an initialized state upon input of at least one clock cycle which has been predetermined so that an output buffer is kept in the high impedance state in a time period from the power-ON to the rise of the predetermined clock cycle.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

PREFERRED EMBODIMENTS

Figure 1:
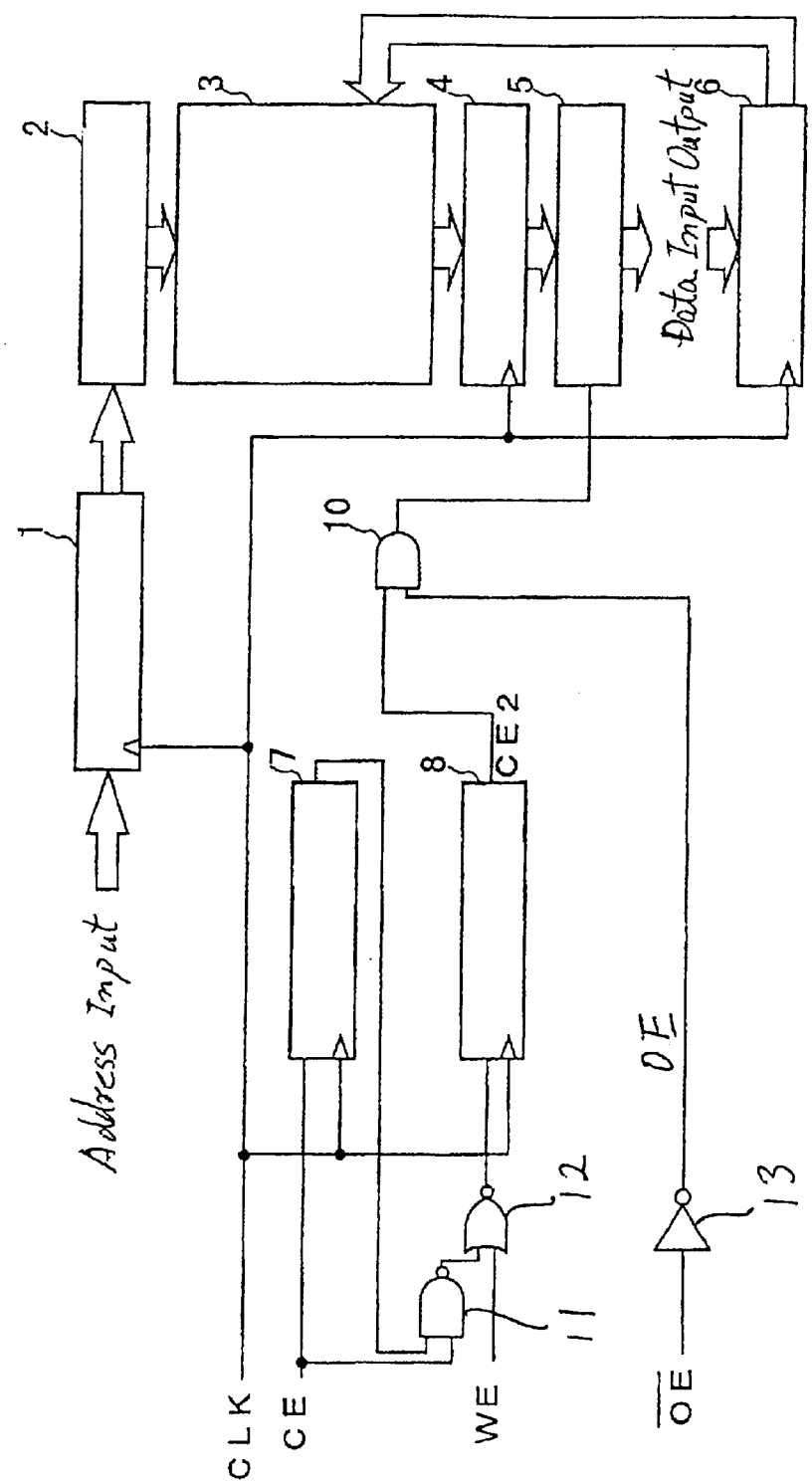
FIG. 1 is a block diagram illustrative of a conventional clock-synchronizing semiconductor memory device.
Figure 2:
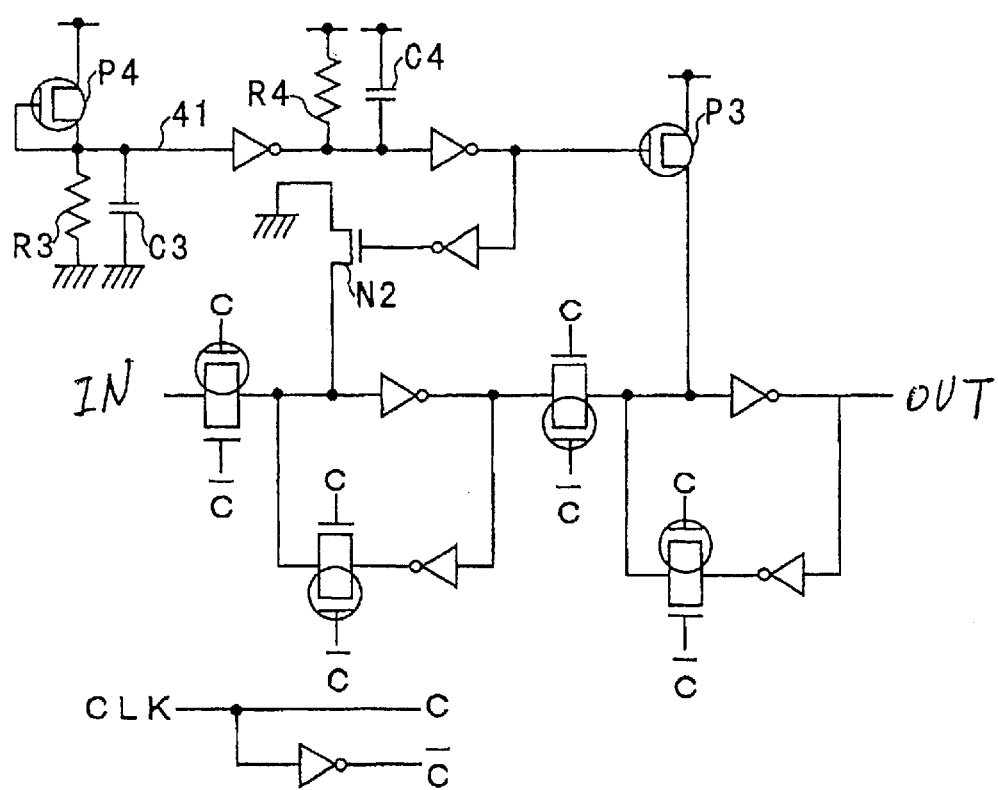
FIG. 2 is a circuit diagram illustrative of a circuit configuration of an output enable register of the conventional clock-synchronizing semiconductor memory device shown in FIG. 1.

FIRST EMBODIMENT:

A first embodiment according to the present invention will be described in detail with reference to FIG. 3 which is a block diagram illustrative of a novel clock-synchronizing semiconductor memory device.

The novel clock-synchronizing semiconductor memory device has an address register 1 for receiving an address input and outputting address data in synchronizing with an externally inputted clock signal "CLK". The address register 1 sends the input value to the output side upon rise-edge of the clock signal "CLK" for subsequent holding the value until the next rise-edge of the clock signal "CLK". Further, an address decoder 2 is provided which is connected to the address register 1 for receiving the address data from the address register 1. A memory cell array is also provided which is connected to the address decoder 2 for receiving the address data from the address decoder 2. An input register 6 is also provided which receives data externally inputted. The input register 6 also receives the clock signal "CLK" so that the input register 6 is operable in synchronizing with the clock signal "CLK". The input register 6 sends the input value to the output side upon rise-edge of the clock signal "CLK" for subsequent holding the value until the next rise-edge of the clock signal "CLK". The input register 6 is connected to the memory cell array 3 so as to transmit data to the memory cell array 3, whereby the data are stored in the memory cell array 3 at a designated address from the address decoder. An output register 4 is further provided which is connected to the memory cell array 3 for fetching the data from the memory cell array 3. The output register 4 receives the clock signal "CLK" so that the output register 4 is operable in synchronizing with the clock signal "CLK". The output register 4 sends the input value to the output side upon rise-edge of the clock signal "CLK" for subsequent holding the value until the next rise-edge of the clock signal "CLK". An output buffer 5 is further provided which is connected to the output register 4 for receiving the output data from the output register 4. The output buffer 5 is controlled by the following signals and circuits. A resistor 7 is provided which receives the clock signal "CLK" and a chip select enable signal "CE". A NAND gate 11 is also provided which has two inputs, one of which is connected to an output of the resistor 7, for receiving the chip select enable signal "CE" and an output signal from the register 7. The register 7 is operable in synchronizing with the clock signal "CLK". The register 7 sends the input value to the output side upon rise-edge of the clock signal "CLK" for subsequent holding the value until the next rise-edge of the clock signal "CLK". A NOR gate 12 is also provided which has two inputs, one of which is connected to an output of the NAND gate 11, for receiving an output signal from the NAND gate 11 and a write enable signal "WE". An output enable resistor 8 is also provided which has two inputs, one of which is connected to an output of the NOR gate 12, for receiving an output from the NOR gate 12 and also receiving the clock signal CLK. The output enable register 8 is operable in synchronizing with the clock signal CLK to output an output "CE2". The output enable register 8 sends the input value to the output side upon rise-edge of the clock signal "CLK" for subsequent holding the value until the next rise-edge of the clock signal "CLK". An invertor 13 is also provided which has an input for receiving an output enable signal "OE-bar" and then outputting the output enable signal "OE".

A reset circuit 9 is also provided which has an input for receiving the clock signals "CLK", so that the reset circuit 9 is operable to output a reset signal in synchronizing with the clock signal "CLK". An AND gate 10 is also provided which has two inputs, wherein one input is connected to an output of the output enable register 8 for receiving the output "CE2" from the output enable register 8 and another input is connected to an output from an AND gate 14. The AND gate 14 has two inputs, wherein one input is connected to the output of the reset circuit 9 for receiving an output from the reset circuit 9 and other input is connected to an output of an invertor 13. The invertor 13 has an output enable signal "OE-bar" for receiving the output enable signal "OE" from the invertor 13. The output enable signal "OE" is not synchronizing with the clock signal CLK. The output "CE2" is synchronizing with the clock signal CLK. The AND gate 10 has an output which is connected to the output buffer 5 so that the output buffer 5 is controlled by the output signal from the AND gate 10.

Figure 3:
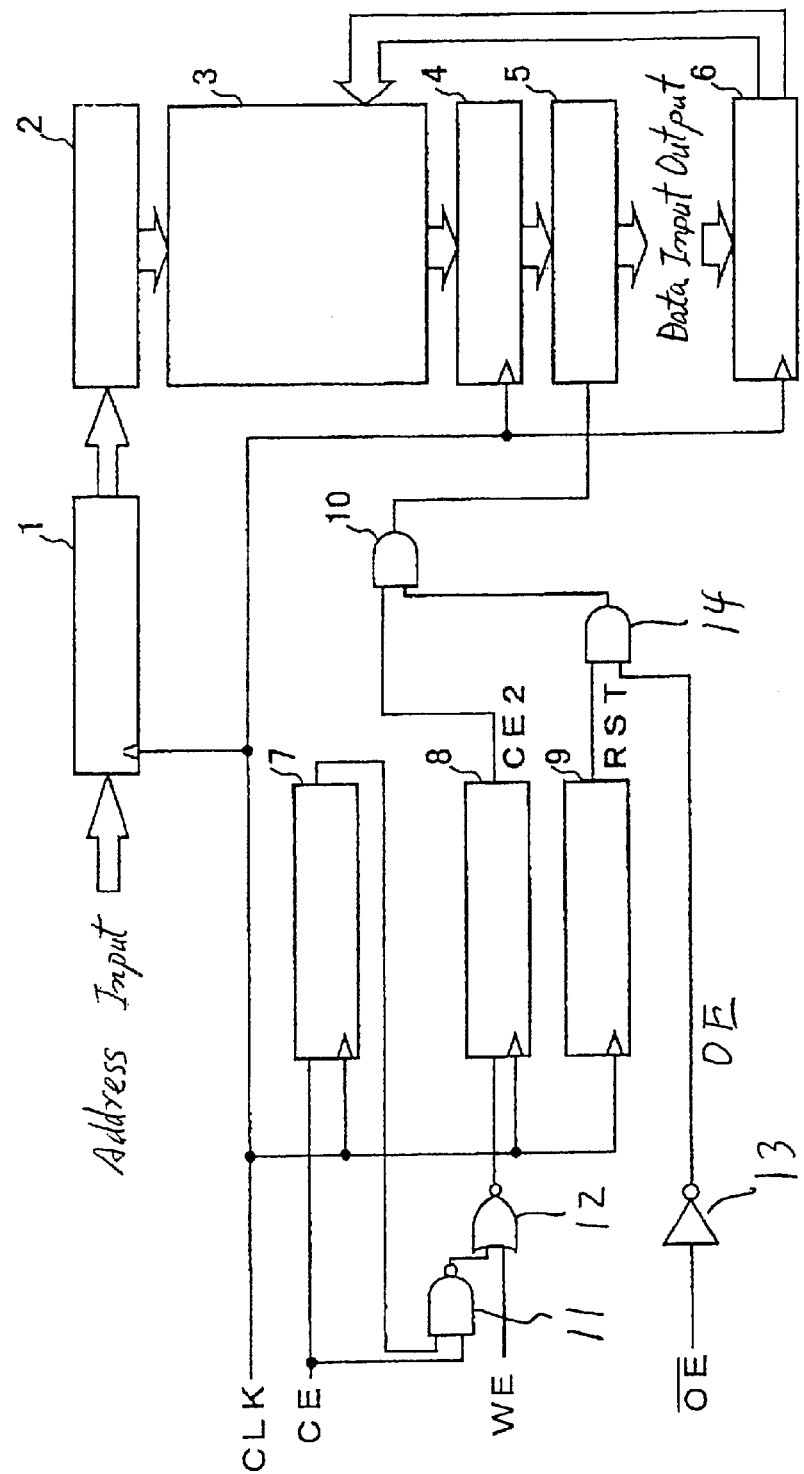
FIG. 3 is a block diagram illustrative of a novel clock-synchronizing semiconductor memory device in first and second embodiment in accordance with the present invention.
Figure 4:
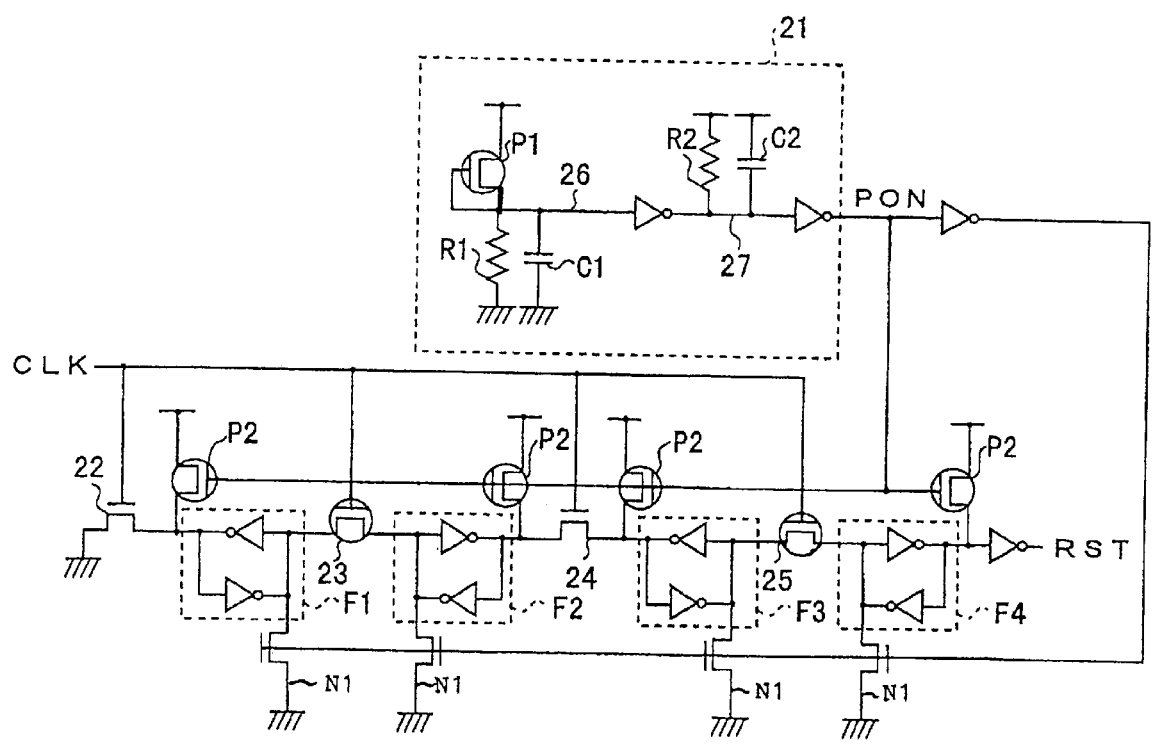
FIG. 4 is a circuit diagram illustrative of a reset circuit in the novel clock-synchronizing semiconductor memory device shown in FIG. 3 in a first embodiment in accordance with the present invention.

FIG. 4 is a circuit diagram illustrative of a reset circuit in the novel clock-synchronizing semiconductor memory device shown in FIG. 3. The reset circuit 9 shown in FIG. 3 has a series connection of first to fourth flip flop circuits F1, F2, F3 and F4. The first flip flop circuit F1 is connected through a first transfer gate 22 to a ground line. The second flip flop circuit F2 is connected through a second transfer gate 23 to the first flip flop circuit F1. The third flip flop circuit F3 is connected through a third transfer gate 24 to the second flip flop circuit F2. The fourth flip flop circuit F4 is connected through a fourth transfer gate 25 to the third flip flop circuit F3. A reset signal "RST" is outputted from the fourth flip flop circuit F4 through an invertor. Each of the first to fourth flip flop circuits F1, F2, F3 and F4 is connected through a p-channel MOS field effect transistor P2 to a high voltage line and also connected through an n-channel MOS field effect transistor N1 to a ground line so as to allow the p-channel MOS field effect transistor P2 to initialize each of the first to fourth flip flop circuits F1, F2, F3 and F4. Gates of the n-channel MOS field effect transistors N1 and the p-channel MOS field effect transistors P2 are also connected to an output of a power-ON circuit 21. The power-ON circuit 21 has a parallel connection of a first resistance R1 and a first capacitance C1 between a node 26 and the ground line. The power-ON circuit 21 also has a parallel connection of a second resistance R2 and a second capacitance C2 between a node 27 and the ground line. The node 26 is also connected through a p-channel MOS field effect transistor P1 to the high voltage line. The nodes 26 and 27 are connected to each other through an invertor. The node 27 is also connected through an invertor 27 to an output of the power-ON circuit 21.

Operations of the above novel clock-synchronizing semiconductor memory device will be described with reference again to FIG. 3. Upon a power-ON, the provisions of the first capacitance C1 and the first resistance R1 render the node 26 become the low level and the node 27 become the high level, whereby an output "PON" from the power-ON circuit 21 becomes low level. During the rise of the power, the p-channel MOS field effect transistor P1 is initiated to turn ON, for which reason the node 26 becomes the high level whilst the node 27 becomes the low level. In rising the power source, there is a time period when the output "PON" of the power-ON circuit 21 is placed in the low level. Further, the gates of the p-channel MOS field effect transistors P2 receive the output signals "PON" from the power-ON circuit 21. The gates of the n-channel MOS field effect transistors N1 receive the inverted signal from the output "PON" of the power-ON circuit 21. Therefore, the p-channel MOS field effect transistors P2 and the n-channel MOS field effect transistors N1 turn ON whereby the first to fourth flip flop circuits F1, F2, F3 and F4 in the reset circuit 9 are initialized in a uniform direction. Further, a threshold voltage of the p-channel MOS field effect transistor P1 is set higher than those of other transistors to prevent that the ON-timing of the transistor is too fast to turn ON of the p-channel transistor P2 and the n-channel transistor N1.

It is also required that the p-channel MOS field effect transistors P2 and the n-channel MOS field effect transistors N1 have sizes which are sufficiently larger than those of the transistors in the first to fourth flip flop circuits F1 to F4 for certain initializations of the first to fourth flip flop circuits F1 to F4. The initializations of the first to fourth flip flop circuits F1 to F4 result in setting the output "RST" from the reset circuit 9 in the low level, whereby, in rising the power source, the output buffer 5 is placed in the high impedance state.

After an input of the clock signal is initiated, the reset circuit shows the following operations. If the clock terminal has a low level at a time when the power is risen, then the transfer gate 22 turns ON upon initial rising of the clock CLK from the low level to the high level, whereby the flip flop circuit F1 is inverted. When the clock CLK is fallen from the high level to the low level, the transfer gate 23 turns ON whereby the flip flop circuit F2 is inverted. When the clock CLK is risen from the low level to the high level, the transfer gate 24 turns ON whereby the flip flop circuit F3 is inverted. When the clock CLK is fallen from the high level to the low level, the transfer gate 25 turns ON whereby the flip flop circuit F4 is inverted. After all of the fist to fourth flip flop circuits F1, F2, F3 and F4 have been inverted, the output "RST" from the reset circuit 9 becomes high level whereby the reset state is released.

Figure 5:
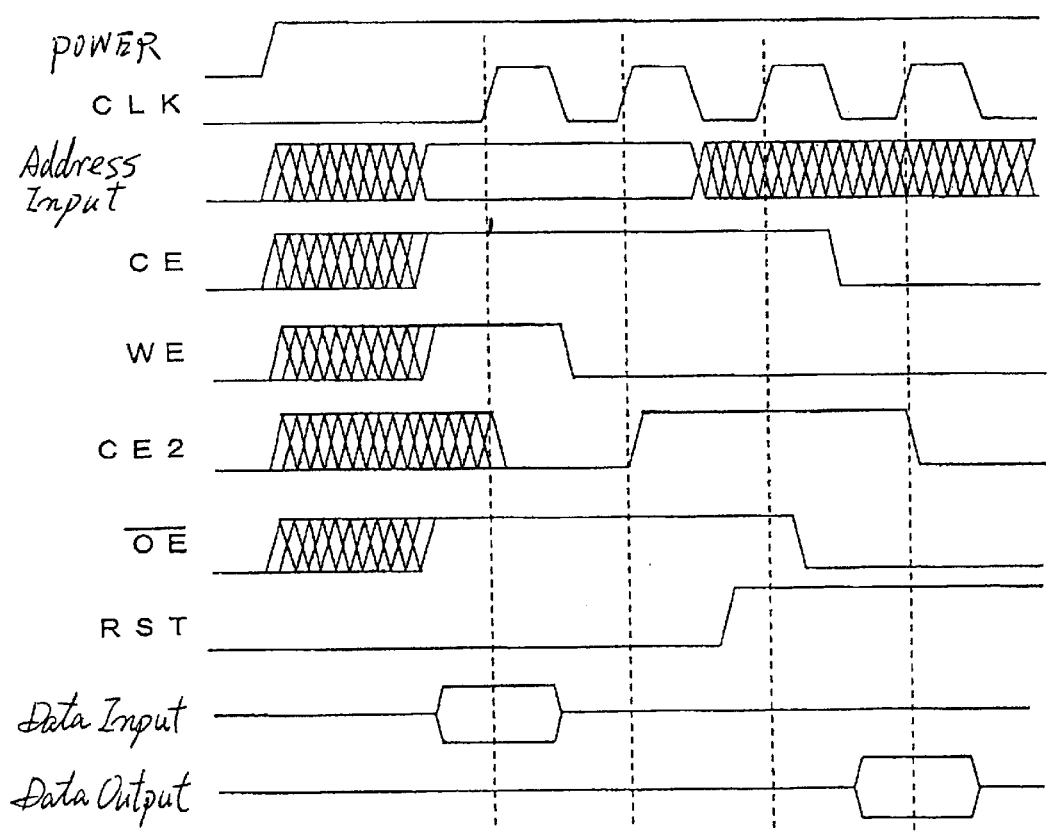
FIG. 5 is a timing chart of signals transmitted in the above novel clock-synchronizing semiconductor memory device of FIG. 3 in a first embodiment in accordance with the present invention.

FIG. 5 is a timing chart of signals transmitted in the above novel clock-synchronizing semiconductor memory device of FIG. 3. There is a time interval or a time period after the power-ON until the chip select enable signal "CE", the write enable signal "WE", and the output enable signal "OE-bar" as externally inputted are fixed for control of the operations of the clock-synchronizing semiconductor memory device. Thereafter, upon the rising of the initial or first clock cycle, the operations of the clock-synchronizing semiconductor memory device are initiated. The output EC2 from the output enable resistor 8 is not fixed until the rising of the first clock cycle.

Immediately after the power-ON, no data have not yet been stored in the memory cell arrays. In the first clock cycle, the write operation is required to be made, for which reason read-out operation is made in the second or later clock cycle. It is therefore possible to obtain effective read out data in the third or later clock cycle. For this reason, it is necessary that the timing of the release of the reset signal is prior to the rising of the third clock cycle.

Even the waveforms shown in FIG. 5 appear if the clock signal "CLK" immediately after the power-ON is in the low level. Actually, however, it is possible that the clock signal "CLK" becomes high level following to the power-ON. It is also possible that the voltage level of the clock signal "CLK" is varied in a time period when the control signals are indefinite due to any causes such as noises.

Figure 6:
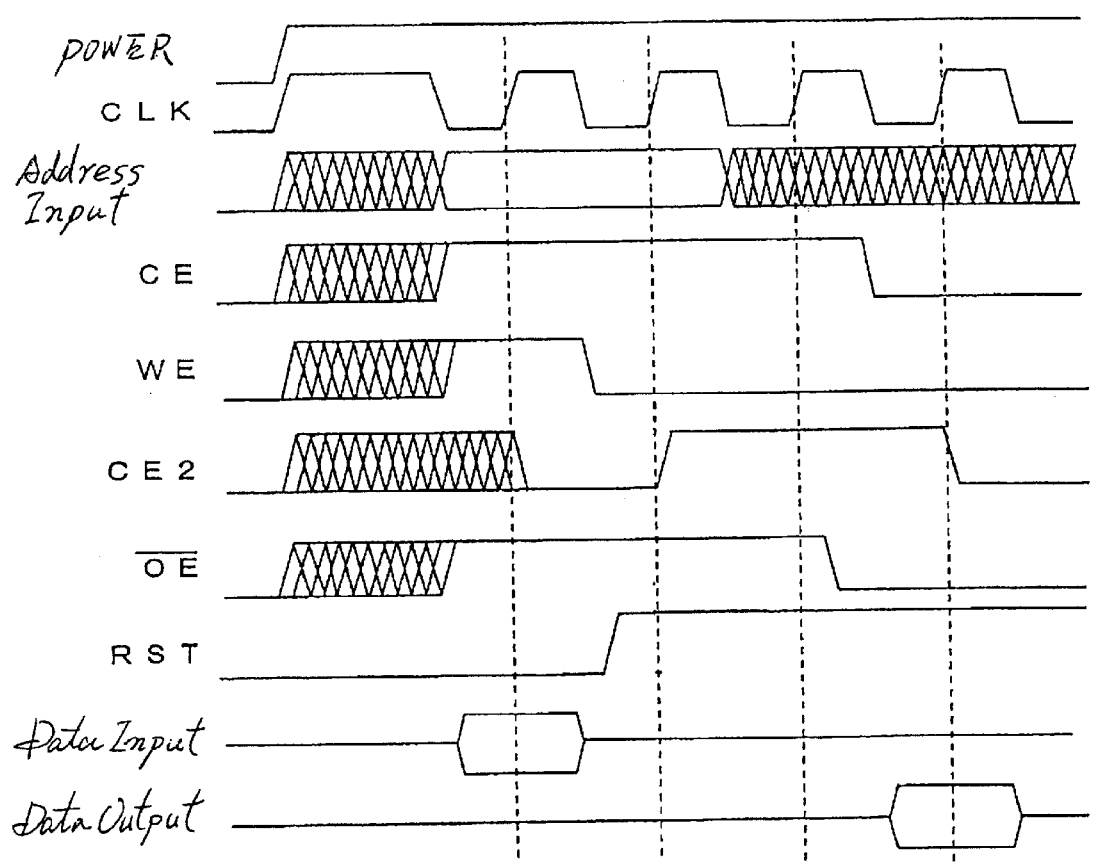
FIG. 6 is a timing chart of signals transmitted in the above novel clock-synchronizing semiconductor memory device of FIG. 3 when variations in voltage level of the clock signals are varied in a first embodiment in accordance with the present invention.
Figure 7:
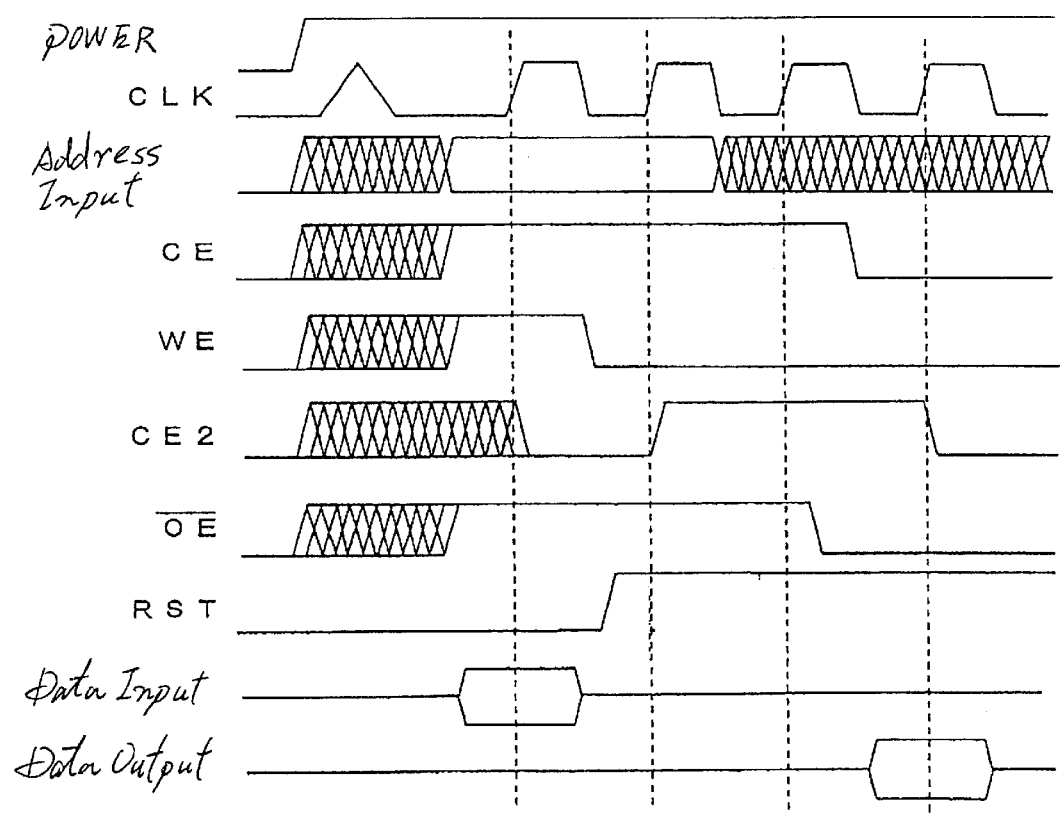
FIG. 7 is a timing chart of signals transmitted in the above novel clock-synchronizing semiconductor memory device of FIG. 3 when variations in voltage level of the clock signals are varied in a first embodiment in accordance with the present invention.

FIGS. 6 and 7 are timing charts of signals transmitted in the above novel clock-synchronizing semiconductor memory device of FIG. 3 when the control signals are indefinite due to any causes such as noises.

In any cases, the timing of the release of the reset signal "RST" becomes earlier by one cycle due to the variation of the clock "CLK". Notwithstanding, the output buffer 5 is entered into the high impedance state until the rising of the first or initial clock.

Depending upon the types of the memory devices, it is possible that the fastest effective data reading operation is conducted after the fourth clock cycle. In this case, it is possible to form a highly reliable reset circuit against the variations of the voltage levels of the clock signals immediately after the power-ON by increase of the number of stages of the flip flop circuits.

The above novel clock-synchronizing semiconductor memory device provides the following effects.

The first effect is concerned with allowing the output from the semiconductor memory device to be kept in the high impedance state after the power-ON until the operation of the clock is initiated without any external control to the output control terminal, because the output from the reset circuit places the output buffer in the high impedance state until the operation of the clock is initiated so that after a predetermined number of the clock cycles has appeared, then the reset state is released.

The second effect is concerned with that the reset state is not released even variations in voltage level of the clock signals immediately after the power-ON because it is possible to prevent the release of the reset state even when the variations in voltage level of the clock signals immediately after the power-ON by increasing the number of the stages of the flip flop circuits in the reset circuit.

The third effect is concerned with no reduction in operation speed of the semiconductor memory device even adding the reset circuit because the reset circuit I provided to give no influence to the signal pass of the output enable register.

SECOND EMBODIMENT:

A second embodiment according to the present invention will be described in detail with reference to FIG. 3 which is a block diagram illustrative of a novel clock-synchronizing semiconductor memory device.

The novel clock-synchronizing semiconductor memory device has an address register 1 for receiving an address input and outputting address data in synchronizing with an externally inputted clock signal "CLK". The address register 1 sends the input value to the output side upon rise-edge of the clock signal "CLK" for subsequent holding the value until the next rise-edge of the clock signal "CLK". Further, an address decoder 2 is provided which is connected to the address register 1 for receiving the address data from the address register 1. A memory cell array is also provided which is connected to the address decoder 2 for receiving the address data from the address decoder 2. An input register 6 is also provided which receives data externally inputted. The input register 6 also receives the clock signal "CLK" so that the input register 6 is operable in synchronizing with the clock signal "CLK". The input register 6 sends the input value to the output side upon rise-edge of the clock signal "CLK" for subsequent holding the value until the next rise-edge of the clock signal "CLK". The input register 6 is connected to the memory cell array 3 so as to transmit data to the memory cell array 3, whereby the data are stored in the memory cell array 3 at a designated address from the address decoder. An output register 4 is further provided which is connected to the memory cell array 3 for fetching the data from the memory cell array 3. The output register 4 receives the clock signal "CLK" so that the output register 4 is operable in synchronizing with the clock signal "CLK". The output register 4 sends the input value to the output side upon rise-edge of the clock signal "CLK" for subsequent holding the value until the next rise-edge of the clock signal "CLK". An output buffer 5 is further provided which is connected to the output register 4 for receiving the output data from the output register 4. The output buffer 5 is controlled by the following signals and circuits. A register 7 is provided which receives the clock signal "CLK" and a chip select enable signal "CE". A NAND gate 11 is also provided which has two inputs, one of which is connected to an output of the register 7, for receiving the chip select enable signal "CE" and an output signal from the register 7. The register 7 is operable in synchronizing with the clock signal "CLK". The register 7 sends the input value to the output side upon rise-edge of the clock signal "CLK" for subsequent holding the value until the next rise-edge of the clock signal "CLK". A NOR gate 12 is also provided which has two inputs, one of which is connected to an output of the NAND gate 11, for receiving an output signal from the NAND gate 11 and a write enable signal "WE". An output enable register 8 is also provided which has two inputs, one of which is connected to an output of the NOR gate 12, for receiving an output from the NOR gate 12 and also receiving the clock signal CLK. The output enable register 8 is operable in synchronizing with the clock signal CLK to output an output "CE2". The output enable register 8 sends the input value to the output side upon rise-edge of the clock signal "CLK" for subsequent holding the value until the next rise-edge of the clock signal "CLK". An invertor 13 is also provided which has an input for receiving an output enable signal "OE-bar" and then outputting the output enable signal "OE".

A reset circuit 9 is also provided which has an input for receiving the clock signals "CLK", so that the reset circuit 9 is operable to output a reset signal in synchronizing with the clock signal "CLK". An AND gate 10 is also provided which has two inputs, wherein one input is connected to an output of the output enable register 8 for receiving the output "CE2" from the output enable resistor 8 and another input is connected to an output from an AND gate 14. The AND gate 14 has two inputs, wherein one input is connected to the output of the reset circuit 9 for receiving an output from the reset circuit 9 and other input is connected to an output of an invertor 13. The invertor 13 has an output enable signal "OE-bar" for receiving the output enable signal "OE" from the invertor 13. The output enable signal "OE" is not synchronizing with the clock signal CLK. The output "CE2" is synchronizing with the clock signal CLK. The AND gate 10 has an output which is connected to the output buffer 5 so that the output buffer 5 is controlled by the output signal from the AND gate 10.

Figure 8:
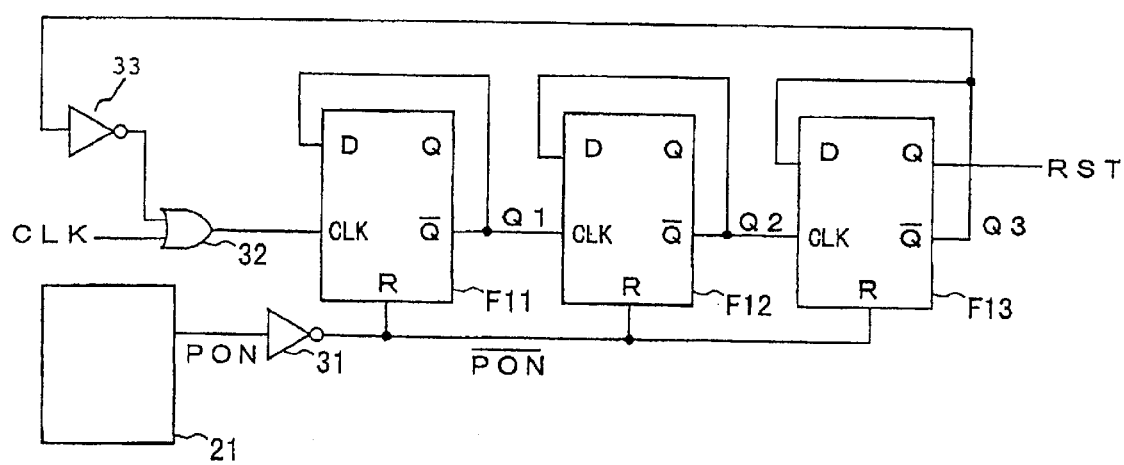
FIG. 8 is a circuit diagram illustrative of a reset circuit in the novel clock-synchronizing semiconductor memory device shown in FIG. 3 in a second embodiment in accordance with the present invention.

FIG. 8 is a circuit diagram illustrative of a reset circuit in the novel clock-synchronizing semiconductor memory device shown in FIG. 3. The reset circuit 9 shown in FIG. 3 has a power-ON circuit 21 which has the same circuit configuration as the power-ON circuit 21 shown in FIG. 4. An output signal "PON" from the power-ON circuit 21 is inverted by an invertor 31 to be supplied to reset terminals "R" of first to third D-flip flop circuits F11, F12 and F13 which are connected in series to each other. Each of the first to third D-flip flop circuits F11, F12 and F13 is operated to transmit a signal inputted to a D-terminal in rising the clocks CLK to a Q-terminal so that an inverted signal appears on a Q-inverted terminal thereof. If the high level is applied to the reset terminal "R", then the Q-terminal becomes low level whilst the Q-inverted terminal becomes high level.

The Q-inverted terminal of the first D-flip flop circuit F11 is connected to a clock terminal CLK of the second D-flip flop circuit F12 and also connected to the D-terminal of the first D-flip flop circuit F11. The Q-inverted terminal of the second D-flip flop circuit F12 is connected to a clock terminal CLK of the third D-flip flop circuit F13 and also connected to the D-terminal of the second D-flip flop circuit F12. The Q-inverted terminal of the third D-flip flop circuit F13 is connected to the D-terminal of the third D-flip flop circuit F13. An OR gate 32 has two inputs, wherein one input is connected to an output of an invertor 33 and other input receives the clock signal CLK.

Figure 9:
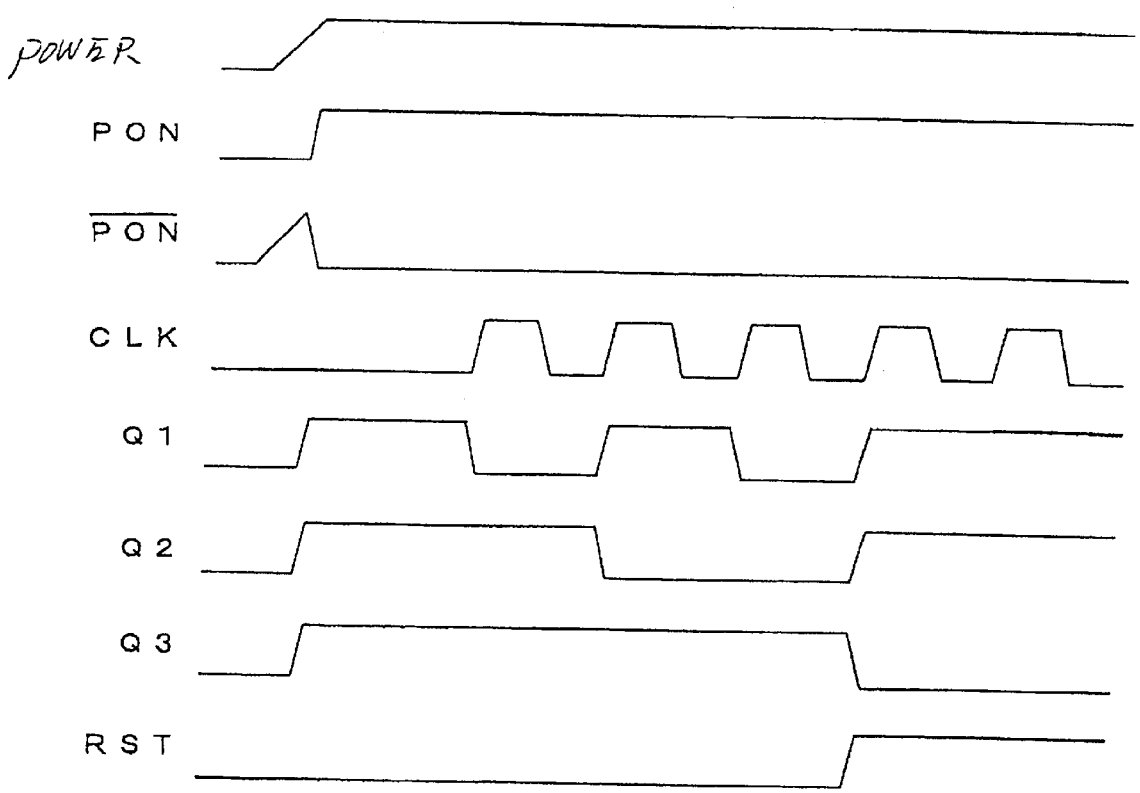
FIG. 9 is a timing chart of signals transmitted in the above novel clock-synchronizing semiconductor memory device of FIG. 3 in a first embodiment in accordance with the present invention.

FIG. 9 is a timing chart of signals transmitted in the above novel clock-synchronizing semiconductor memory device. Upon the power-ON, the power-ON circuit 21 is operated to enter the output "PON" into the low level. The output "PON" is then inverted by the invertor 31 to be inputted into the reset terminals "R" of the first to third D-flip flop circuits F11, F12 and F13 whereby the first to third D-flip flop circuits F11, F12 and F13 are re-set and the Q-terminals and the Q-inverted terminals of the first to third D-flip flop circuits F11, F12 and F13 are initialized to be the low and high levels respectively. The output signals Q1, Q2 and Q3 from the first to third D-flip flop circuits F11, F12 and F13 are varied only when the clocks are risen, for which reason the output "RST" is changed from the low level to the high level when the same number of the clocks have been risen as 2 to the second power namely 4.

Upon rising the fourth clock, the output signal Q3 from the third D-flip flop F13 becomes low level, whereby the input into the OR gate 32 becomes high level. As a result, the inputs into the clock terminal of the first D-flip flop circuit is fixed thereafter whereby the output "RST" of the reset circuit is fixed at high level.

The above novel clock-synchronizing semiconductor memory device provides the following effects.

The first effect is concerned with allowing the output from the semiconductor memory device to be kept in the high impedance state after the power-ON until the operation of the clock is initiated without any external control to the output control terminal, because the output from the reset circuit places the output buffer in the high impedance state until the operation of the clock is initiated so that after a predetermined number of the clock cycles has appeared, then the reset state is released.

The second effect is concerned with that the reset state is not released even variations in voltage level of the clock signals immediately after the power-ON because it is possible to prevent the release of the reset state even when the variations in voltage level of the clock signals immediately after the power-ON by increasing the number of the stages of the flip flop circuits in the reset circuit.

The third effect is concerned with no reduction in operation speed of the semiconductor memory device even adding the reset circuit because the reset circuit I provided to give no influence to the signal pass of the output enable register.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A control circuit for controlling an operation of an output buffer circuit in a clock-synchronizing semiconductor memory device, said control circuit comprising:

a reset circuit configured for i) setting a timing for release from a reset state and also ii) keeping said output buffer circuit in a high impedance state during a time period from a power-ON to a rise of a predetermined clock cycle of a clock signal, the predetermined clock cycle being a fixed number greater than one.

2. The control circuit of claim 1, wherein the reset circuit comprising a plural number of cascaded stages and the predetermined number of clock cycles is determined by the number of cascaded stages.

3. The control circuit of claim 1, wherein the reset circuit comprises:

a series connection of at least four flip-flop circuits, the first of the flip-flop circuits being connected through a first transfer gate to a ground line and the remaining flip-flop circuits being connected to a preceding one of the series-connected flip-flop circuits through a connecting transfer gate;

a reset signal terminal connected to the output of a final one of the series connected flip-flop circuits;

each of the flip-flop circuits being coupled to a high voltage line via a corresponding first FET;

each of the flip-flop circuits being coupled to the ground line via a corresponding second FET;

a power-ON signal terminal connected to gates of the first FETs; and an inverted power-ON signal terminal connected to gates of the second FETs.

4. The control circuit of claim 3, wherein the addition of a further series connected flip-flop circuit increases the predetermined number of clock cycles by one.

5. The control circuit of claim 1, wherein the reset circuit comprises a series connection of at least three D flip-flops, the first of the D flip-flops being coupled to a clock signal and to a Q-inverted terminal of a last one of the series connected D flip-flops, the remaining D flip-flop being connected to a Q-inverted output of a preceding one of the series connected D flip-flops, each D flip-flop having its own Q-inverted output connected to its D input and having its R input connected to a power-ON inverted signal.

6. The control circuit of claim 5, wherein the addition of a further series connected D flip-flop increases the predetermined number of clock cycles by one.

7. A clock-synchronizing semiconductor memory device comprising:

a power-ON detection circuit for initializing an output upon a power-ON; and a reset circuit for outputting a reset signal which releases an initialized state upon input of a fixed number of clock cycles, the fixed number being treater than one, so that an output buffer is kept in a high impedance state during a time period from the power-ON to a rise of the fixed numbered clock cycle.

8. The device of claim 7, wherein the reset circuit comprising a plural number of cascaded stages and the predetermined number of clock cycles is determined by the number of cascaded stages.

9. The device of claim 7, wherein the reset circuit comprises:

a series connection of at least four flip-flop circuits, the first of the flip-flop circuits being connected through a first transfer gate to a ground line and the remaining flip-flop circuits being connected to a preceding one of the series-connected flip-flop circuits through a connecting transfer gate;

a reset signal terminal connected to the output of a final one of the series connected flip-flop circuits;

each of the flip-flop circuits being coupled to a high voltage line via a corresponding first FET;

each of the flip-flop circuits being coupled to the ground line via a corresponding second FET;

a power-ON signal terminal connected to gates of the first FETs; and an inverted power-ON signal terminal connected to gates of the second FETs.

10. The device of claim 9, wherein the addition of a further series connected flip-flop circuit increases the predetermined number of clock cycles by one.

11. The device of claim 7, wherein the reset circuit comprises a series connection of at least three D flip-flops, the first of the D flip-flops being coupled to a clock signal and to a Q-inverted terminal of a last one of the series connected D flip-flops, the remaining D flip-flop being connected to a Q-inverted output of a preceding one of the series-connected D flip-flops, each D flip-flop having its own Q-inverted output connected to its D input and having its R input connected to a power-ON inverted signal.

12. The device of claim 11, wherein the addition of a further series connected D flip-flop increases the predetermined number of clock cycles by one.

13. A clock-synchronizing semiconductor memory device comprising:

a reset circuit being initialized upon a power-ON and configured for outputting a reset signal which releases a reset state caused by the power-ON after a predetermined number of clock cycles has appeared so that an output buffer circuit is kept in a high impedance state even after an output from an output enable registor is indefinite immediately after the power-ON, wherein the predetermined number of clock cycles is greater than one.

14. The device of claim 13, wherein the reset circuit comprising a plural number of cascaded stages and the predetermined number of clock cycles is determined by the number of cascaded stages.

15. The device of claim 13, wherein the reset circuit comprises:

a series connection of at least four flip-flop circuits, the first of the flip-flop circuits being connected through a first transfer gate to a ground line and the remaining flip-flop circuits being connected to a preceding one of the series-connected flip-flop circuits through a connecting transfer gate;

a reset signal terminal connected to the output of a final one of the series connected flip-flop circuits;

each of the flip-flop circuits being coupled to a high voltage line via a corresponding first FET;

each of the flip-flop circuits being coupled to the ground line via a corresponding second FET;

a power-ON signal terminal connected to gates of the first FETs; and an inverted power-ON signal terminal connected to gates of the second FETs.

16. The device of claim 15, wherein the addition of a further series connected flip-flop circuit increases the predetermined number of clock cycles by one.

17. The device of claim 13, wherein the reset circuit comprises a series connection of at least three D flip-flops, the first of the D flip-flops being coupled to a clock signal and to a Q-inverted terminal of a last one of the series connected D flip-flops, the remaining D flip-flop being connected to a Q-inverted output of a preceding one of the series connected D flip-flops, each D flip-flop having its own Q-inverted output connected to its D input and having its R input connected to a power-ON inverted signal.

18. The device of claim 17, wherein the addition of a further series connected D flip-flop increases the predetermined number of clock cycles by one.

* * * * *